(12) United States Patent
Vice

(10) Patent No.: US 7,675,359 B2
(45) Date of Patent: Mar. 9, 2010

(54) SWITCH-AROUND LOW NOISE AMPLIFIER

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 100 days.

(21) Appl. No.: 12/128,269

(22) Filed: May 28, 2008

(65) Prior Publication Data

US 2009/0295472 A1 Dec. 3, 2009

(51) Int. Cl.
*H03F 1/14* (2006.01)
(52) U.S. Cl. .................................... 330/51; 330/124 D
(58) Field of Classification Search ................... 330/51, 330/124 D, 288, 298, 207 P
See application file for complete search history.

(56) References Cited

U.S. PATENT DOCUMENTS

| | | | |
|---|---|---|---|
| 7,348,841 B2 * | 3/2008 | Kim et al. | 330/51 |
| 7,385,445 B2 * | 6/2008 | Wright | 330/51 |
| 7,394,313 B2 * | 7/2008 | Kim et al. | 330/51 |
| 7,579,909 B2 * | 8/2009 | Bakalski | 330/51 |

* cited by examiner

*Primary Examiner*—Henry K Choe

(57) ABSTRACT

A switch-around low noise amplifier (LNA) device includes an input for receiving an input signal; an output for outputting an output signal; an LNA transistor coupled between the input and the output; a bypass switch circuit coupled between the input and the output; a current mirror circuit operatively connected to the LNA transistor to control a current flowing through the LNA transistor; a source follower switch operatively connected to the current mirror circuit to selectively turn on and off the current through the current mirror circuit in response to a mode select signal; and a driver adapted to selectively turn on and off the bypass switch circuit in response to the mode select signal. The LNA transistor receives the input signal at its control terminal, and one of the first and second terminals is directly connected to a supply voltage (e.g., ground).

18 Claims, 9 Drawing Sheets

US 7,675,359 B2

SWITCH-AROUND LOW NOISE AMPLIFIER

BACKGROUND

Radio Frequency (RF) signals and components are used in a variety of devices, including mobile communications devices such as mobile telephones. One type of commonly employed RF component is an RF receiver. Many RF receivers employ a low noise amplifier (LNA) at the front end of the receiver to set a low noise figure for the receiver, thereby enhancing the receiver's ability to receive weak signals.

In some applications, the expected range of received input signal levels is so great that it is desired for stronger signals to bypass the gain of the LNA, for example to prevent saturation in the receiver. Accordingly, LNAs have been developed which include an integral bypass switch which can be selectively engaged when the input signal level is above a certain threshold.

FIG. 1 shows a functional block diagram of an RF switch-around low noise amplifier 100. Switch-around low noise amplifier 100 includes a low noise amplifier (LNA) 110 and a bypass switch 120. An RF input signal 115 is provided to LNA 110 and bypass switch 120, only one of which is selectively enabled at any given time by a mode select signal 125. The outputs of LNA 110 and bypass switch 120 are coupled together to provide an RF output signal 135. When the input level of RF input signal 115 is relatively low, then mode select signal 125 selects and enables LNA 110, and disables bypass switch 120. In that case, LNA 110 amplifies RF input signal 115 to produce RF output signal 135. When the input level of RF input signal 115 is above a certain threshold, then mode select signal 125 selects and enables bypass switch 120, and disables LNA 110. In that case, LNA 110 does not amplify RF input signal 115, but instead RF input signal 115 passes through bypass switch 120 to produce RF output signal 135.

In the past, a switch-around LNA has been realized utilizing depletion mode pHEMT device technology. FIG. 2 shows a schematic diagram of one embodiment of such a switch-around LNA 200. Switch-around LNA 200 includes LNA 210 and bypass switch circuit 220. LNA 210 includes field effect transistor (FET) 201, while bypass switch 220 includes FETs 202, 203 and 204. The FETS in switch-around LNA 200, and particularly amplifier FET 201, are depletion mode pHEMT devices. Switch-around LNA 200 receives power from a first supply voltage VDD, and is further connected to a second supply voltage (e.g., ground).

In operation, an RF input signal 215 is provided to LNA 210 and bypass switch circuit 220, only one of which is selectively enabled at any given time by a mode select signal 225. The outputs of LNA 210 and bypass switch circuit 220 are coupled together to provide an RF output signal 235.

It should be noted that mode select signal 225 is produced outside LNA 200 by an external system that evaluates the RF input signal level and in response thereto generates an appropriate mode select signal 225. The external system is not part of LAN 200 proper. In a typical arrangement, this external circuit operates such that when the input level of RF input signal 215 is relatively low (e.g., below a certain threshold), then the external circuit generates a mode select signal 225 having a state that selects and enables LNA 210, and disables bypass switch 220. In that case, LNA 210 amplifies RF input signal 215 to produce RF output signal 235. On the other hand, when the input level of RF input signal 215 is relatively high (e.g., above a certain threshold), then the external circuit generates a mode select signal 225 having a state that selects and enables bypass switch circuit 220, and disables LNA 210. In that case, LNA 210 does not amplify RF input signal 215, but instead RF input signal 215 passes through bypass switch 220 to produce RF output signal 235.

However, switch-around LNA 200 has some shortcomings. First, operation of bypass switch circuit 220 requires an external DC switch 20 that carries the entire current of LNA 210. This level of current is often far higher than what is preferred to be supported by a typical CMOS logic controller that may be employed to implement switch 20. Second, external switch 20 must be bypassed with capacitor 250 to try to effectively restore AC ground to the source of amplifier FET 201. However, it is generally not possible to fully meet the requirement of restoring AC ground to amplifier FET 201 with capacitor 250, as even the best capacitors have an inherent series inductance associated with them that is significant at RF frequencies, and additional trace length to accommodate capacitor 250 adds to the inductance. As a result, the gain of LNA 210 is reduced and, in some cases, the circuit is prone to oscillation.

What is needed, therefore, is an improved switch-around LNA. What is further needed is a switch-around LNA that is more stable against oscillation and provides an improved ground to the active amplifying device of the LNA.

SUMMARY

In an example embodiment, a switch-around low noise amplifier device comprises: an input for receiving an input signal; an output for outputting an output signal; a low noise amplifier transistor coupled between the input and the output; a bypass switch circuit coupled between the input and the output; a current mirror circuit operatively connected to the low noise amplifier transistor to control a current flowing through the low noise amplifier transistor; a source follower switch operatively connected to the current mirror circuit to selectively turn on and off a current through the current mirror circuit in response to a mode select signal; and a driver adapted to selectively turn on and off the bypass switch circuit in response to the mode select signal, wherein the low noise amplifier transistor has first and second terminals and a control terminal, wherein the low noise amplifier transistor receives the input signal at its control terminal, and wherein one of the first and second terminals is directly connected to a supply voltage.

In another example embodiment, a switch-around low noise amplifier device comprises: an input for receiving an input signal; an output for outputting an output signal; a low noise amplifier transistor coupled between the input and the output; a bypass switch circuit coupled between the input and the output; means for selectively enabling and disabling the bypass switch; and means for selectively supplying and disabling current to the low noise amplifier transistor, wherein the low noise amplifier transistor has first and second terminals and a control terminal, wherein the low noise amplifier transistor receives the input signal at its control terminal, and wherein one of the first and second terminals is directly connected to a supply voltage.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to VHF, UHF, microwave and even millimeter wave frequencies to the extent that technology permits the devices and circuits disclosed herein to be fabricated and operated at such frequencies. Also, unless otherwise noted, when a first device is said to be connected to a node, signal, or second device, this encompasses cases where one or more intervening or intermediate devices may be employed to connect the first device to the node, signal, or second device. However, when a first device is said to be "directly connected" to a node, signal, or second device, then it is understood that the first device is connected to the node, signal, or second device without any intervening or intermediate devices interposed therebetween.

Figure 1:
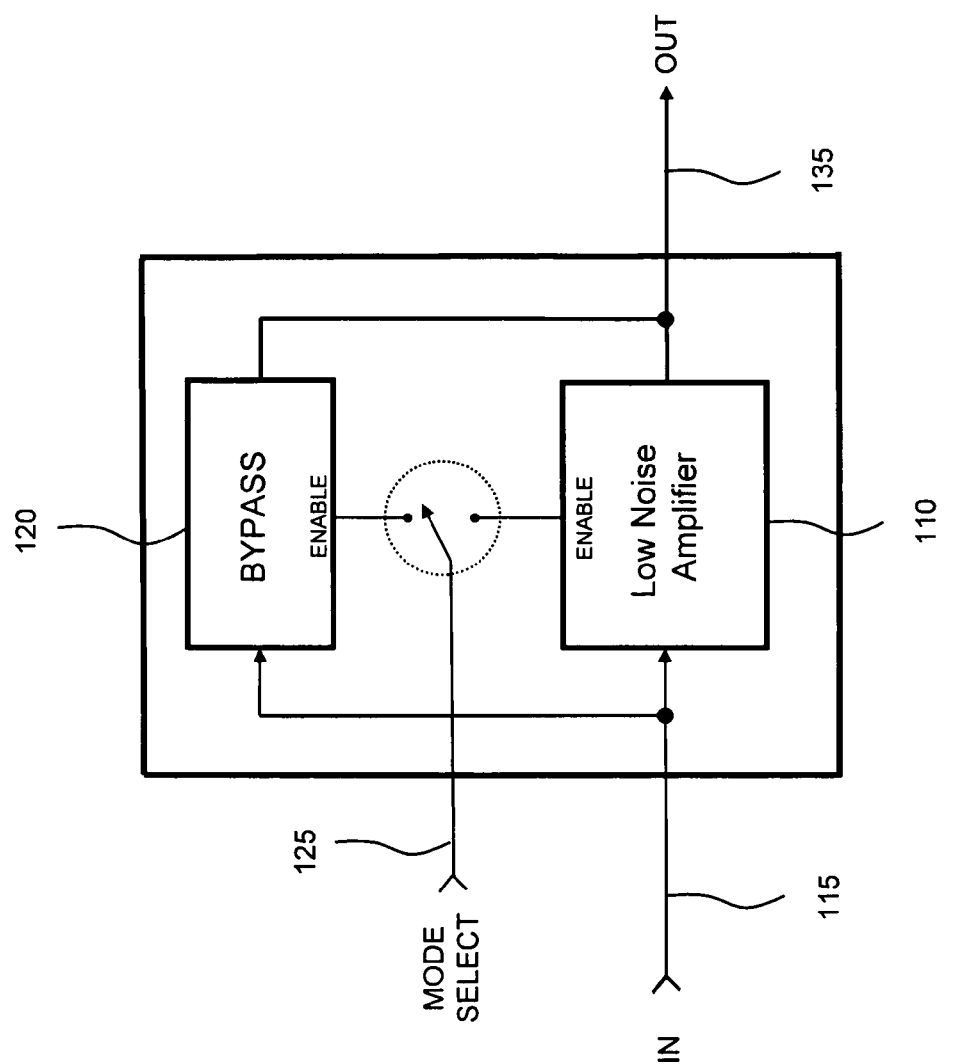
FIG. 1 shows a functional block diagram of a switch-around low noise amplifier (LNA).
Figure 2:
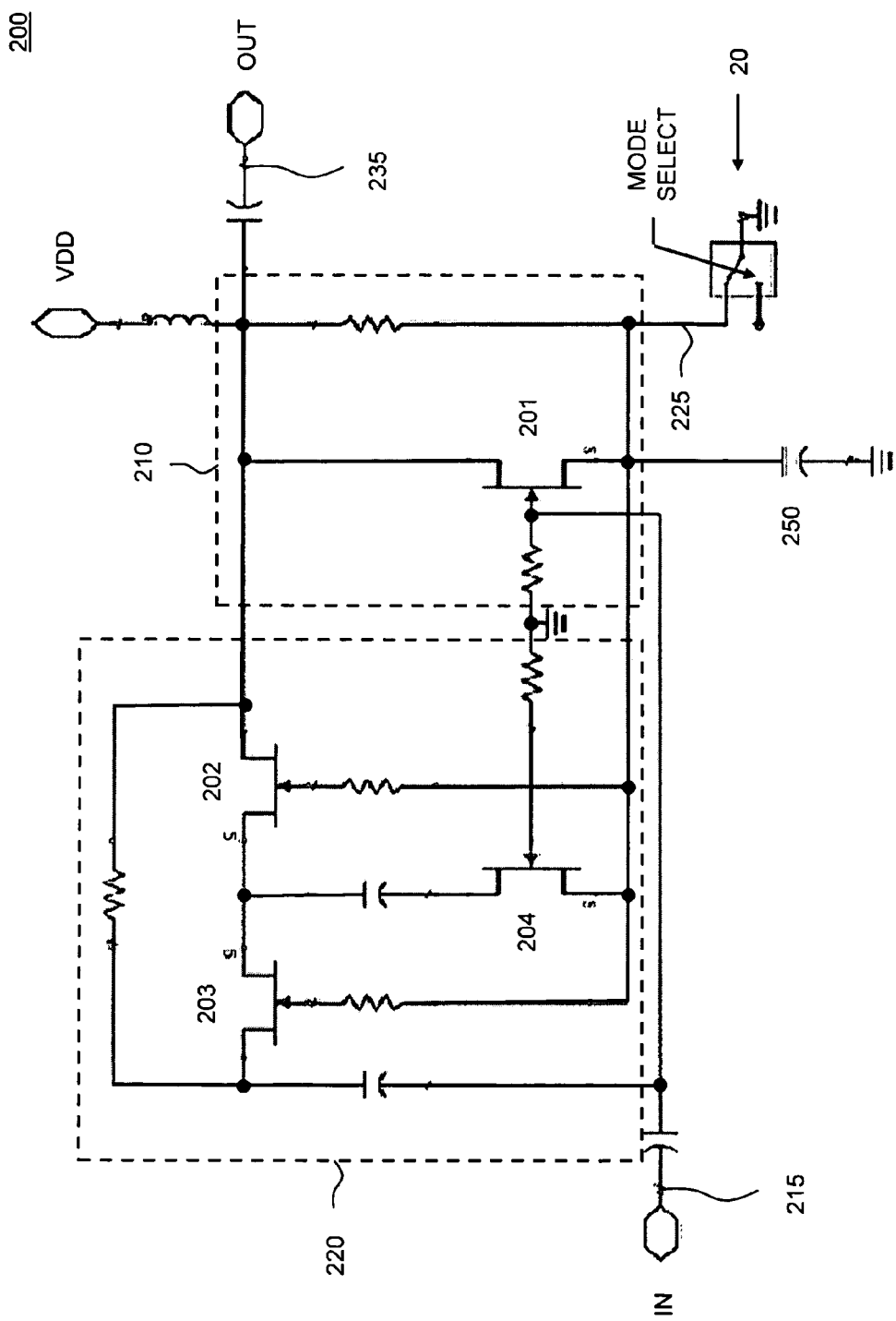
FIG. 2 shows a schematic diagram of a switch-around LNA.
Figure 3:
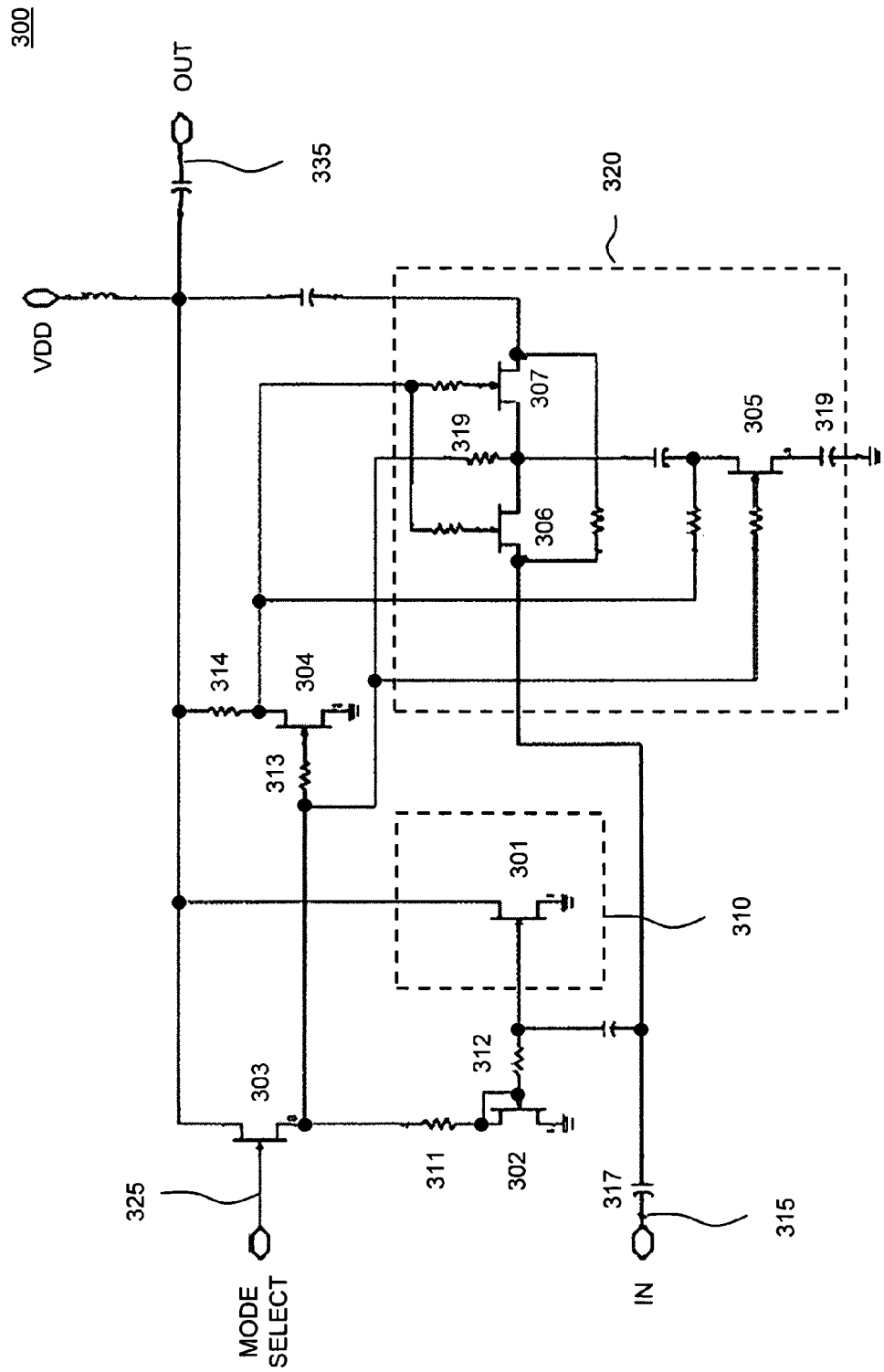
FIG. 3 shows a schematic diagram of a different embodiment of a switch-around LNA.

FIG. 3 shows a schematic diagram of one embodiment of a switch-around low noise amplifier (LNA) 300. Switch-around LNA 300 receives power from a first supply voltage VDD, and is further connected to a second supply voltage (e.g., ground).

Switch-around LNA 300 includes LNA 310 and bypass switch circuit 320, each connected between an input receiving an input signal 315, and an output providing an output signal 335. LNA 310 includes LNA field effect transistor (FET) 301, while bypass switch circuit 320 includes bypass switch FETs 305, 306 and 307. In particular, bypass switch FETs 306 and 307 are connected in series between the input and the output, and bypass switch FET 305 is connected between a node in between bypass switch FETs 306 and 307, and ground (via capacitor 319).

Switch-around LNA 300 also includes a current mirror circuit comprising current mirror transistor 302 and resistors 311 and 312. The current mirror circuit is operatively connected to LNA FET 301 to cause the current flowing through LNA FET 301 to mirror the current flowing through current mirror transistor 302.

Switch-around LNA 300 also includes a source follower switch 303 operatively connected to the current mirror circuit to selectively turn on and off the current through current mirror transistor 303, and thereby to turn on and off the current flowing through LNA FET 301, in response to a mode select signal 325.

Switch-around LNA 300 also includes a driver comprising driver transistor 304 and resistors 313 and 314. The driver is adapted to selectively turn on and off bypass switch circuit 320 in response to mode select signal 325.

In a beneficial arrangement, FET 301 is an enhancement mode FET. In another beneficial arrangement, all transistors in switch-around LNA 300 are enhancement mode FETs.

In operation, RF input signal 315 is provided to LNA 310 and bypass switch circuit 320, only one of which is selectively enabled at any given time by mode select signal 325. It should be noted that mode select signal 325 is produced outside LNA 300 by an external system that evaluates the RF input signal level and in response thereto generates an appropriate mode select signal 325. The outputs of LNA 310 and bypass switch 320 are coupled together to provide RF output signal 335.

When mode select signal 325 is relatively high, e.g., near Vdd), then switch-around LNA 300 operates in a gain mode to turn on source follower switch 303. When source follower switch 303 is turned on, then a current flows from supply voltage VDD through current mirror transistor 302 to ground. As a result, the current is mirrored by LNA FET 301 to place it in an active region ("gain mode of operation"), and thereby "turn on" LNA 310. Accordingly, input signal 315 is amplified by LNA 310 and provided as an amplified output signal 335. Also, as a result of source follower switch 303 being turned on, the gate of driver transistor 304 is pulled high, turning on driver transistor 304 and pulling its drain low. As a result of this, bypass switch transistors 306 and 307 are turned off, and bypass switch transistor 305 is turned on, thereby turning "off" bypass switch circuit 320. Bypass switch transistor 305 is included to bypass any RF leakage of bypass switch circuit 320 when it is in the "off" state to preserve the stability of switch-around LNA 300.

When mode select signal 325 is relatively "low" level (e.g., ground), then switch-around LNA 300 operates in a bypass mode to turn off source follower switch 303. When source follower switch 303 is turned off, then little or no current flows from supply voltage VDD through current mirror transistor 302 to ground. As a result, LNA FET 301 has little or no current flowing through it so that LNA 310 is effectively turned "off." Accordingly, input signal 315 is not amplified by LNA 310. Also, as a result of source follower switch 303 being turned off, driver transistor 304 is turned off, pulling its drain high. As a result of this, bypass switch transistors 306 and 307 are turned on, and bypass switch transistor 305 is turned off, thereby turning "on" bypass switch circuit 320. Accordingly, input signal 315 is provided via bypass switch circuit 320 to output signal 335.

In a beneficial arrangement, it is seen in FIG. 3 that the source of LNA FET 301 is directly connected to the lower supply voltage (e.g., ground) without any series capacitor or other intervening element. Furthermore, it is seen in FIG. 3 that mode select signal 325 requires very little current because it is tied to the gate of source follower switch 303, which can be an enhancement mode FET.

In one particular exemplary embodiment: LNA FET 301 is 400 μm in size; FETs 302, 303 and 304 are each 25 μm in size; FET 305 is 50 μm in size; FETs 306 and 307 are each 100 μm in size; resistor 311 is 4 kΩ; resistor 312 is 2 kΩ; resistor 313 is 10 kΩ; and resistor 314 is 5 kΩ. Appropriate values for the remaining resistors and capacitors can easily be determined.

Figure 4:
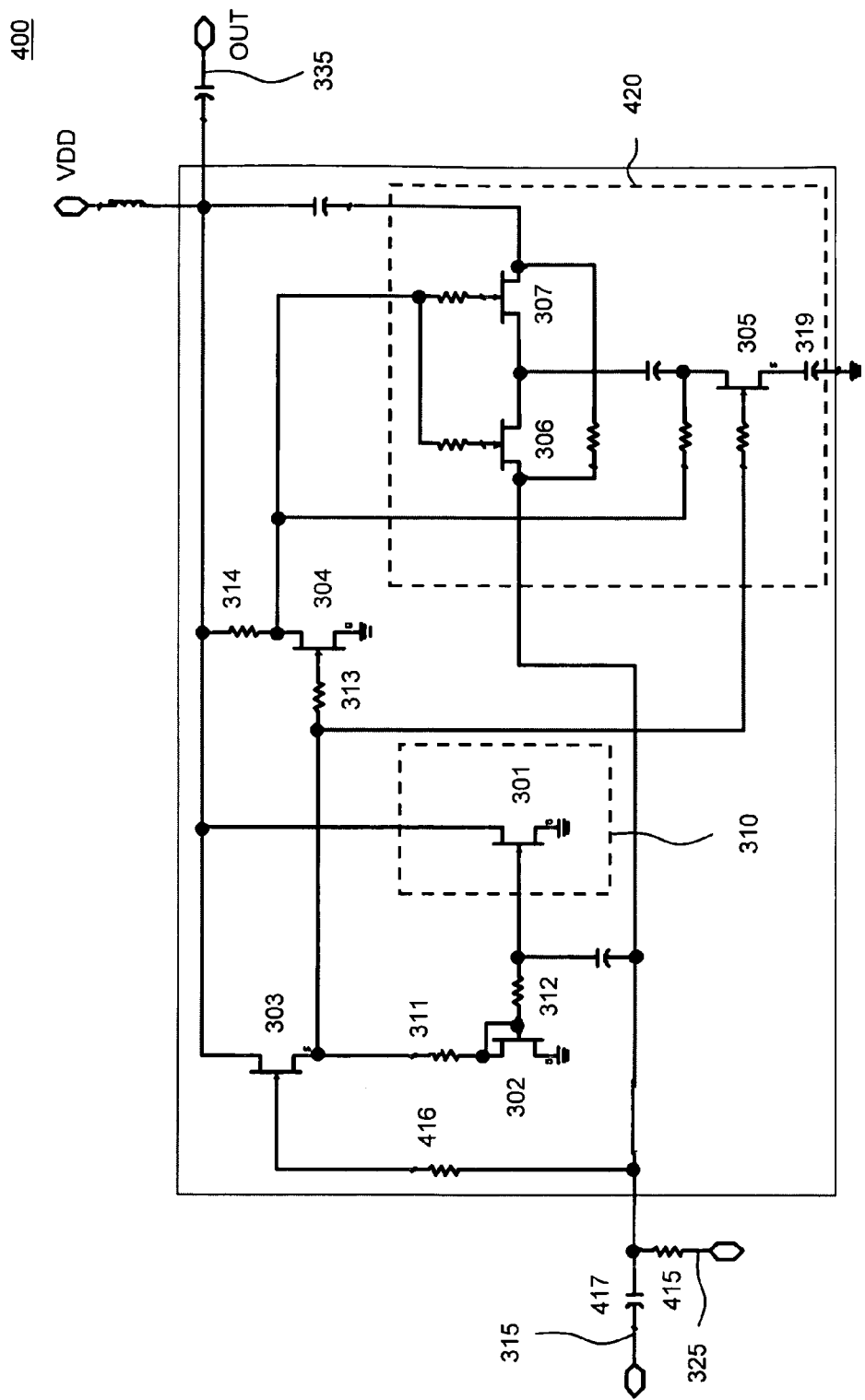
FIG. 4 shows a schematic diagram of an alternative embodiment of a switch-around LNA.

FIG. 4 shows a schematic diagram of an alternative embodiment of a switch-around LNA 400. Switch-around LNA 400 is constructed and operates similarly to switch-around LNA 300 as described above, and so only the differences between switch-around LNA 400 and switch-around LNA 300 will be described. In particular, the bypass switch circuit 420 of switch-around LNA 400 is different from the bypass switch circuit 320 of switch-around LNA 300 in that it omits the resistor 319, and in switch-around LNA 400 input signal 315 and mode select signal 325 are diplexed at a single input terminal by the addition of resistors 415 and 416 and the DC blocking capacitor 417, in place of the single coupling capacitor 317 of LNA 300. In one embodiment, resistors 415 and 416 are each 10 kΩ, and capacitor 417 is 10 pF.

Figure 5:
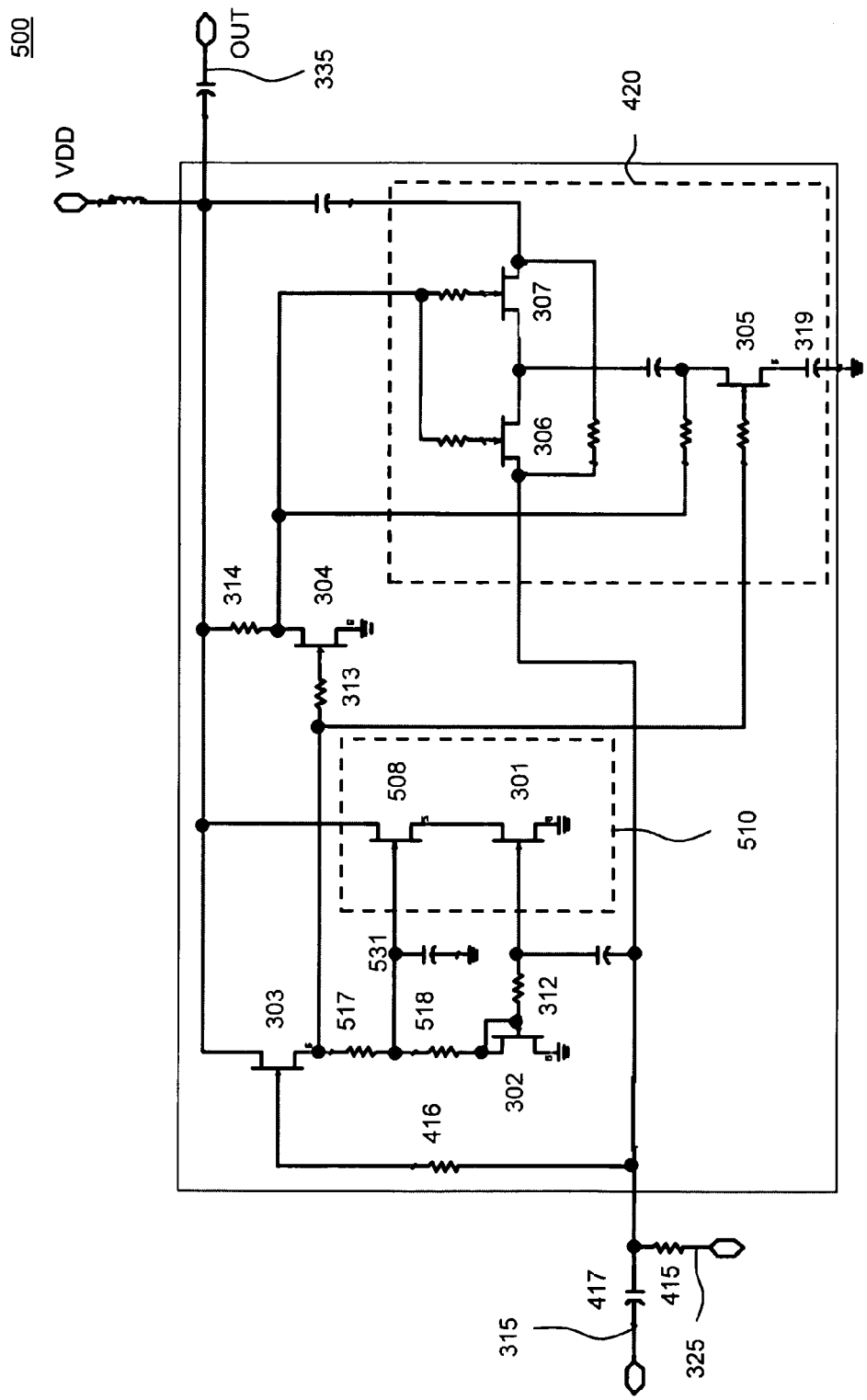
FIG. 5 shows a schematic diagram of another alternative embodiment of a switch-around LNA.

FIG. 5 shows a schematic diagram of another alternative embodiment of a switch-around LNA 500. Switch-around LNA 500 is constructed and operates similarly to switch-around LNA 400 as described above, and so only the differences between switch-around LNA 500 and switch-around LNA 400 will be described. In particular, the LNA 510 of switch-around LNA 500 is different from LNA 310 of switch-around LNAs 300 and 400. LNA 510 includes an additional LNA FT 508, an additional capacitor 531, and replaces resistor 311 with the series combination of resistors 517 and 518 to realize a cascode amplifier arrangement. An advantage of the cascode amplifier arrangement of LNA 510 is increased gain compared to LNA 310. In one embodiment: LNA FET 508 is the same size as LNA FET 301; the sum of the resistance values of resistors 517 and 518 is the same as the resistance value of resistor 311 of LNA 310; and capacitor 531 has a capacitance value of about 1 pF. In one particular arrangement, resistors 517 and 518 have the same resistance values as each other.

It should be understood that various other arrangements are possible. For example, although the embodiments shown in FIGS. 4-5 reflect cumulative modifications to the embodiment of FIG. 3, any combination of these modifications could be employed. For example, in one embodiment, switch-around LNA 300 could be modified to employ the cascode amplifier of switch-around LNA 500, but without the diplexing arrangement shown in FIGS. 4 and 5, and/or without the omission of resistor 319. It is apparent that any combination of the various modifications illustrated in FIGS. 4-5 is possible.

Figure 6:
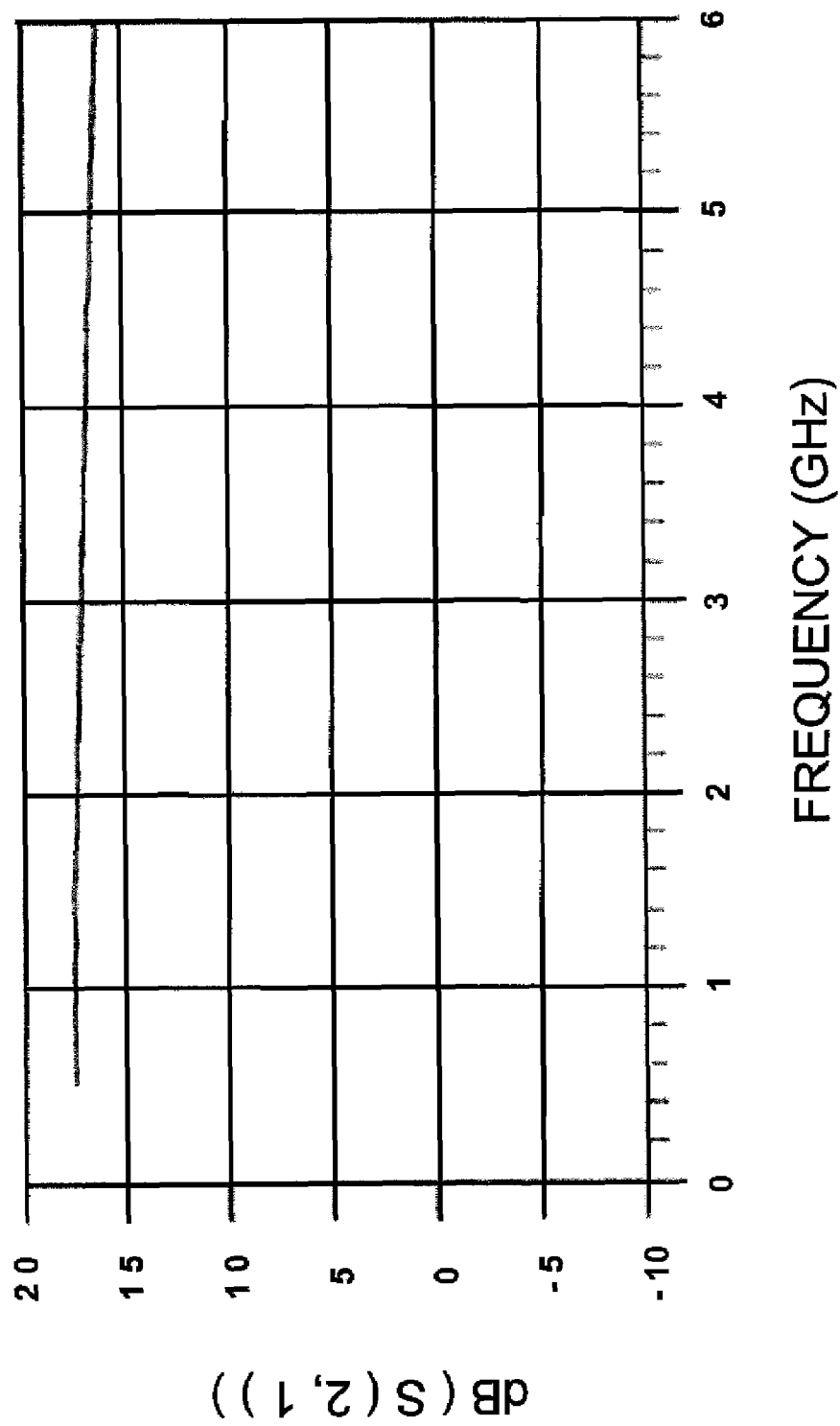
FIG. 6 shows gain as a function of frequency for one embodiment of the switch-around LNA of FIG. 3 when operating in the gain mode.

FIG. 6 shows gain as a function of frequency for one embodiment of a switch-around LNA as shown in FIG. 3 when operating in the gain mode. As can be seen in FIG. 6, the gain is relatively flat over a frequency range of several GHz.

Figure 7:
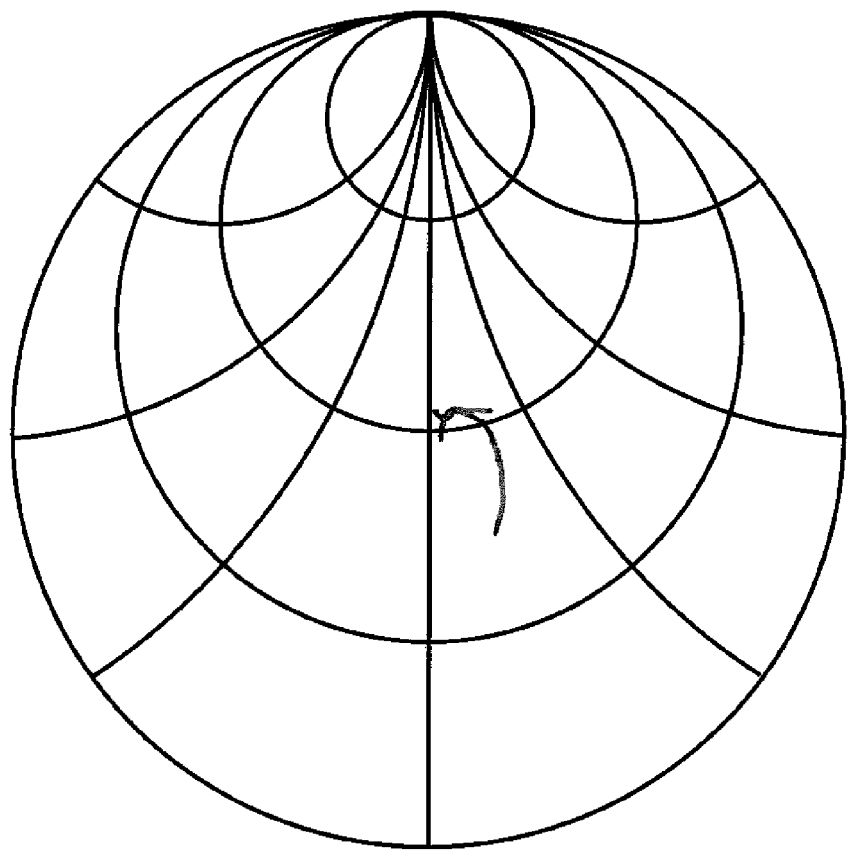
FIG. 7 shows input and output impedance match for one embodiment of the switch-around LNA of FIG. 3 when operating in the gain mode.

FIG. 7 shows the input and output impedance match for one embodiment of a switch-around LNA as shown in FIG. 3 when operating in the gain mode.

Figure 8:
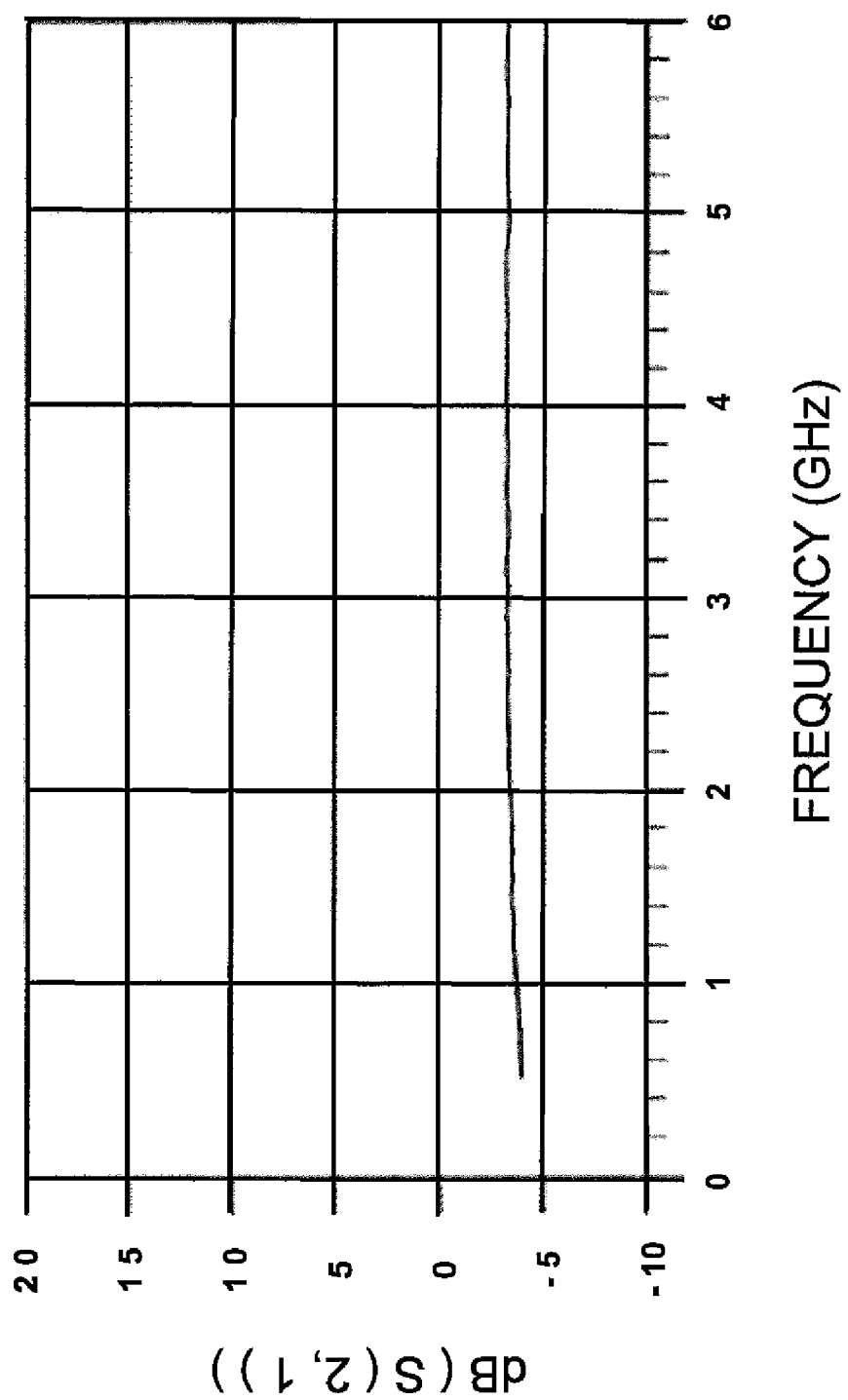
FIG. 8 shows gain as a function of frequency for one embodiment of the switch-around LNA of FIG. 3 when operating in the bypass mode.

FIG. 8 shows gain as a function of frequency for one embodiment of a switch-around LNA as shown in FIG. 3 when operating in the bypass mode. As can be seen in FIG. 8, in the bypass mode the "gain" is actually negative (i.e., a loss) and is relatively flat over a frequency range of several GHz.

Figure 9:
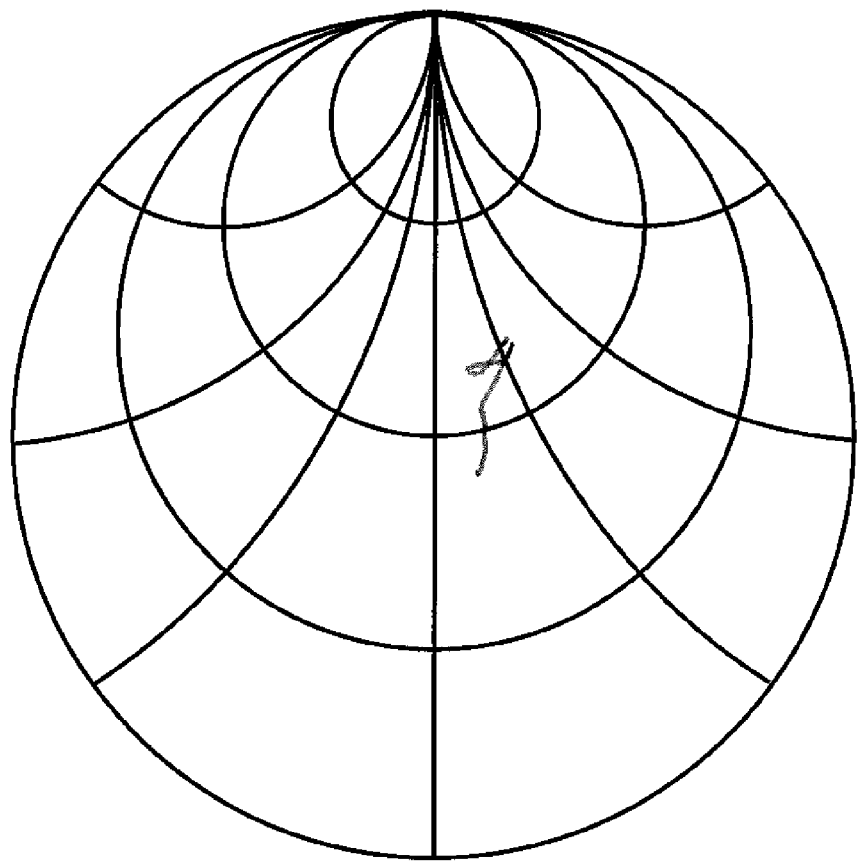
FIG. 9 shows input and output impedance match for one embodiment of the switch-around LNA of FIG. 3 when operating in the bypass mode.

FIG. 9 shows the input and output impedance match for one embodiment of a switch-around LNA as shown in FIG. 3 when operating in the bypass mode.

While example embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A switch-around low noise amplifier device, comprising:
   an input for receiving an input signal;
   an output for outputting an output signal;
   a first low noise amplifier transistor coupled between the input and the output;
   a bypass switch circuit coupled between the input and the output;
   a current mirror circuit operatively connected to the first low noise amplifier transistor to control a current flowing through the low noise amplifier transistor;
   a source follower switch operatively connected to the current mirror circuit to selectively turn on and off a current flowing through the current mirror circuit in response to a mode select signal; and
   a driver adapted to selectively turn on and off the bypass switch circuit in response to the mode select signal,
   wherein the first low noise amplifier transistor has first and second terminals and a control terminal, wherein the first low noise amplifier transistor receives the input signal at its control terminal, and wherein one of the first and second terminals is directly connected to a supply voltage.

2. The device of claim 1, wherein the first low noise amplifier transistor is an enhancement mode field effect transistor.

3. The device of claim 2, wherein the source of the first low noise amplifier transistor is directly connected to ground.

4. The device of claim 1, wherein the bypass switch circuit comprises first and second switch transistors connected in series between the input and the output, and a third switch transistor connected between ground and a node in between the first and second switch transistors.

5. The device of claim 4, wherein the first, second and third switch transistors are all enhancement mode field effect transistors.

6. The device of claim 1, wherein the source follower switch is connected in series with the current mirror circuit between a supply voltage and ground.

7. The device of claim 1, wherein the source follower switch comprises an enhancement mode field effect transistor.

8. The device of claim 1, wherein the driver is an enhancement mode field effect transistor operatively coupled to an output of the source follower switch.

9. The device of claim 1, further comprising a second low noise amplifier transistor connected in series with the first low noise amplifier transistor between the input and the output.

10. The device of claim 1, wherein the input signal and the mode select signal are diplexed at the input of the device.

11. A switch-around low noise amplifier device, comprising:
    an input for receiving an input signal;
    an output for outputting an output signal;
    a first low noise amplifier transistor coupled between the input and the output;
    a bypass switch circuit coupled between the input and the output;
    means for selectively enabling and disabling the bypass switch circuit; and
    means for selectively supplying and disabling current to the first low noise amplifier transistor,
    wherein the first low noise amplifier transistor has first and second terminals and a control terminal, wherein the first low noise amplifier transistor receives the input signal at its control terminal, and wherein one of the first and second terminals is directly connected to a supply voltage.

12. The device of claim 11, wherein the first low noise amplifier transistor is an enhancement mode field effect transistor.

13. The device of claim 12, wherein the source of the first low noise amplifier transistor is directly connected to ground.

14. The device of claim 11, wherein the bypass switch circuit comprises first and second switch transistors connected in series between the input and the output, and a third switch transistor connected between ground and a node in between the first and second switch transistors.

15. The device of claim 14, wherein the first, second and third switch transistors are all enhancement mode field effect transistors.

16. The device of claim 11, wherein the means for selectively enabling and disabling the bypass switch circuit, and the means for selectively supplying and disabling current to the low noise amplifier transistor, both operate in response to a mode control signal.

17. The device of claim 11, further comprising a second low noise amplifier transistor connected in series with the first low noise amplifier transistor between the input and the output.

18. The device of claim 11, wherein the input signal and the mode select signal are diplexed at the input of the device.

* * * * *